United States Patent [19]
Jamal et al.

[11] Patent Number: 5,757,821
[45] Date of Patent: May 26, 1998

[54] METHOD AND APPARATUS FOR DETECTING COMMUNICATION SIGNALS HAVING UNEQUAL ERROR PROTECTION

[75] Inventors: Karim Jamal, Tokyo, Japan; Johan Nystrom, Stockholm, Sweden

[73] Assignee: Telefonaktiebolaget LM Ericsson, Stockholm, Sweden

[21] Appl. No.: 684,792

[22] Filed: Jul. 22, 1996

[51] Int. Cl.$^6$ .................................................. H03M 13/00
[52] U.S. Cl. .................. 371/30; 371/37.06; 371/43.6; 371/43.7; 375/340; 375/341
[58] Field of Search ...................... 371/30, 37.06, 371/43.6, 43.7; 375/341, 340

[56] References Cited

U.S. PATENT DOCUMENTS

| | | | |
|---|---|---|---|
| 4,047,151 | 9/1977 | Rydbeck et al. | 371/41 |
| 5,416,804 | 5/1995 | Khaled et al. | 375/341 |
| 5,467,132 | 11/1995 | Fazel et al. | 348/390 |

FOREIGN PATENT DOCUMENTS

| | | |
|---|---|---|
| 0 156 413 | 10/1985 | European Pat. Off. . |
| 0 220 781 | 5/1987 | European Pat. Off. . |
| 0 571 019 | 11/1993 | European Pat. Off. . |
| 0 643 493 | 3/1995 | European Pat. Off. . |
| WO93/19519 | 9/1993 | WIPO . |
| WO93/22853 | 11/1993 | WIPO . |

OTHER PUBLICATIONS

Hagenauer et al., "A Viterbi Algorithm with Soft–Decision Outputs and its Applications", IEEE Globecom '89, Dallas TX, Conference Record vol. 3, pp. 47.1.1–47.1.7, Nov., 1989.

Bahl et al., "Optimal Decoding of Linear Codes for Minimizing Symbol Error Rate", IEEE Transactions on Information Theory, Mar. 1974.

Lodge et al., Separable MAP Filters for the Decoding of Product and Concatenated Codes (ICC93), Geneva, May 1993.

Seshadri et al., "Advanced Techniques for Modulation, Error Correction, Channel Equalization, and Diversity", AT&T Technical Journal, vol. 72, No. 4, pp. 48–63, Jul.–Aug. 1993.

Helsinki, "Channel Coding in Analogue Public Land Mobile Network", Nordic Seminar on Digital Land Mobile Radio-communication, pp. 58–66, Feb. 1985.

Hoeher, "Unequal Error Protection for Digital Mobile DS–CDMA Radio Systems", New Orleans Supercomm/ICC '94 Serving Humanity Through Communications, 1994 IEEE International Conference on Communications, vol. 3, pp. 1236–1241, May 1994.

*Primary Examiner*—Stephen M. Baker
*Attorney, Agent, or Firm*—Burns, Doane, Swecker & Mathis, L.L.P.

[57] ABSTRACT

A method and system for transmitting signals using unequal error protection (UEP). According to the method, symbols having a higher level of coding protection are detected and decoded first, soft reliability information is generated, and then the previously detected symbols and soft reliability information are used to detect and decode symbols having the next lower level of coding protection. The symbols having lower levels of coding protection benefit from the decoding of all previous classes of symbols. Data symbols can be interleaved to further enhance system performance.

21 Claims, 4 Drawing Sheets

FIG. 5

| B[k−2] | $f_{11}[k-2], f_{21}[k-2], f_{31}[k-2]$ | $f_{12}[k-1], f_{22}[k-1], f_{32}[k-1]$ | $f_{13}[k], f_{23}[k], f_{33}[k]$ |
| --- | --- | --- | --- |
| B[k−1] | $f_{11}[k-1], f_{21}[k-1], f_{31}[k-1]$ | $f_{12}[k], f_{22}[k], f_{32}[k]$ | $f_{13}[k+1], f_{23}[k+1], f_{33}[k+1]$ |
| B[k] | $f_{11}[k], f_{21}[k], f_{31}[k]$ | $f_{12}[k+1], f_{22}[k+1], f_{32}[k+1]$ | $f_{13}[k+2], f_{23}[k+2], f_{33}[k+2]$ |
| B[k+1] | $f_{11}[k+1], f_{21}[k+1], f_{31}[k+1]$ | $f_{12}[k+2], f_{22}[k+2], f_{32}[k+2]$ | $f_{13}[k+3], f_{23}[k+3], f_{33}[k+3]$ |

METHOD AND APPARATUS FOR DETECTING COMMUNICATION SIGNALS HAVING UNEQUAL ERROR PROTECTION

FIELD OF THE INVENTION

The present invention generally relates to the transmission of encoded digital communication signals. More particularly, the present invention relates to a method and apparatus for detecting digital communication signals encoded with uneven error protection.

BACKGROUND OF THE INVENTION

Conventional digital communication systems often incorporate some form of unequal error protection, which can be referred to as forward error control coding (FEC) or unequal error protection (UEP). In a UEP scheme, certain information symbols are deemed to be more important, or more sensitive to transmission or reception errors than other symbols. The more important symbols are coded (e.g., in a channel encoder) with a lower coding rate (i.e., using increased redundancy) than the less important data symbols to increase the probability of accurate reception and detection. The result of such a scheme is that the receiver has more information about the more important symbols, and less information about the less important symbols.

In conventional digital communication systems, channel encoding and modulation are typically performed separately in the transmitter, and conventional receivers typically perform detection and channel decoding separately. In the copending, commonly-assigned application 08/305,787, entitled "SIMULTANEOUS DEMODULATION AND DECODING OF A DIGITALLY MODULATED RADIO SIGNAL", filed on Sep. 14, 1994 now U.S. Pat. No. 5,673,291, the entirety of which is incorporated by reference, a scheme for decoding and demodulating received signals is disclosed in which certain symbols (sync symbols) known to the receiver are decoded first, and the decoded known symbols are then used to decode adjacent, unknown coded symbols. However, such a system is complicated in that the known sync symbols must be interleaved with unknown symbols at the transmitter using one of a limited number of interleaving patterns. Further, the disclosed system includes a differential detector or an MLSE detector, and "hard" information, that is, information which has been quantized into the symbol alphabet, is fed back to the detector. The use of hard information generally requires increased reliance on a CRC check in the system, and can result in error propagation and limited performance.

The Viterbi algorithm is a standard tool in communication receivers, performing functions such as demodulation, decoding, equalization, etc. In general, the Viterbi algorithm provides a maximum likelihood estimation of a sequence of transmitted data which has been coded, subjected to inter-symbol interference (ISI), or both. It is known to modify the Viterbi algorithm to generate a soft reliability indicator, in addition to the most likely path sequence. The soft reliability indicator can be, for example, the a posteriori probability for each bit or some other reliability value. This modification to the Viterbi algorithm is referred to as a soft-output Viterbi algorithm (SOVA), and is described in more detail in, for example, Hagenauer et al., "A Viterbi Algorithm with Soft-Decision Outputs and its Applications", IEEE Globecom '89, Dallas Tex., Conference Record Vol. 3, pp. 47.1.1–47.1.7, November, 1989. An alternative soft output reliability algorithm is described in Bahl et al., "Optimal Decoding of Linear Codes for Minimizing Symbol Error Rate", IEEE Transactions on Information Theory, March 1974.

In a communication system using unequal error protection, several coding rates are used simultaneously, and the bits or symbols having lower coding rates (more coding protection) are more reliably received and decoded at the receiver than the bits or symbols having higher coding rates (lower coding protection). It would be desirable to use the additional reliability information to increase the detection performance of the system for bits or symbols receiving less protection.

It would further be desirable for a digital communication system to rely on soft information feedback at the receiver to reduce the sensitivity of the system to error propagation.

SUMMARY OF THE INVENTION

The present invention overcomes the above-mentioned problems, and achieves other advantages, by providing a method for transmitting digital communication signals in which data symbols to be transmitted are encoded with one of N levels of coding protection, and the transmitted symbols are detected in groups starting with the group of symbols having the highest level of coding protection. A first group of symbols having the highest level of coding protection is detected and decoded, and soft reliability information is calculated for these symbols. A second group of symbols, having a lower level of coding protection, is then detected and decoded using the soft information obtained from the detection and decoding of the first group of symbols. Because there is provided a channel memory and/or a modulation memory, the decoding of the second group of symbols can be further enhanced by the decoding of the first group. As will be appreciated by those of ordinary skill in the art, a radio signal received at a given time instant can contain contributions from the previous and present transmitted symbols due to multipath propagation. In this manner, the detection of symbols having a lower level of coding protection can be enhanced by the detection of symbols having a higher level of coding protection. Also, if differential modulation is used, inter-symbol dependence can be used to enhance the detection.

The process is repeated, with each group of symbols at a particular level of coding protection being detected and decoded using the symbols and associated soft reliability values of any or all previously detected and decoded symbols, until the symbols having the lowest level of coding protection are detected and decoded. The lowest level of coding protection can be no protection; that is, uncoded data symbols.

The transmission method of the present invention can also include interleaving coded data symbol frames, transmitting the interleaved symbol frames in bursts, and detecting the data symbols in groups according to the level of coding protection. The detected symbols are de-interleaved, decoded, and re-interleaved together with their soft reliability in formation, and mapped into their representation in the received bursts. The detection of groups of symbols having lower levels of coding protection is performed using the information obtained from all previous detections. Depending upon the degree of mixing of symbols within a burst, detection of the symbols having lower levels of protection is made more reliable not only from the previously detected (and now "known") symbols in the same frame, but also from all symbols contained in previous frames within the same burst.

BRIEF DESCRIPTION OF THE DRAWINGS

A more complete understanding of the present invention can be obtained upon reading the following Detailed Description of the Preferred Embodiments in conjunction with the attached drawings, in which like reference indicia indicate like elements, and in which:

FIG. 5 is a diagram showing interleaved bursts of coded symbols received according to an embodiment of the method of the present invention.

DETAILED DESCRIPTION OF THE PREFERRED EMBODIMENTS

Figure 1A:
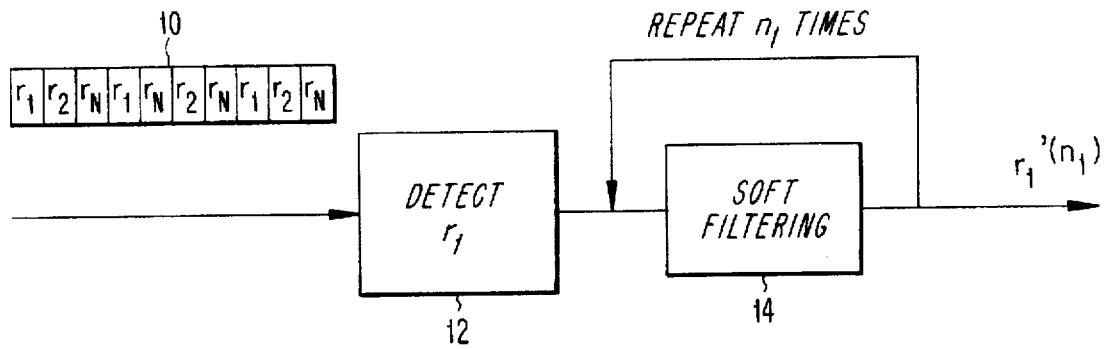
FIGS. 1A–C are block diagrams of exemplary receiving circuits according to an embodiment of the present invention.
Figure 1B:
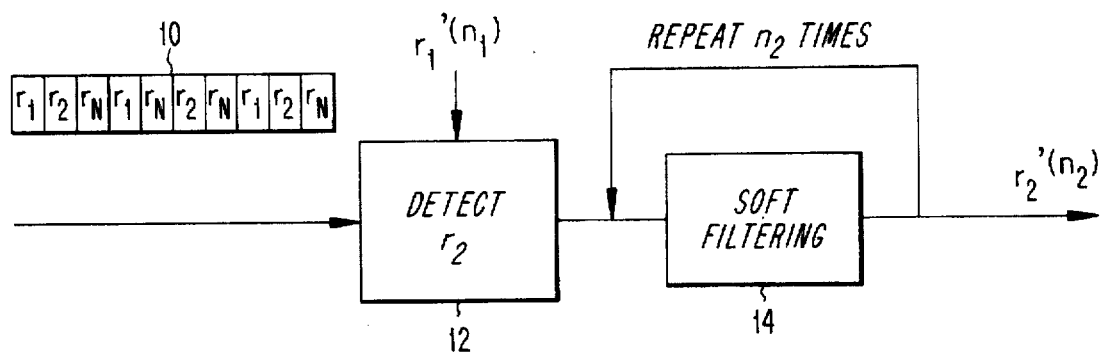
Figure 1C:
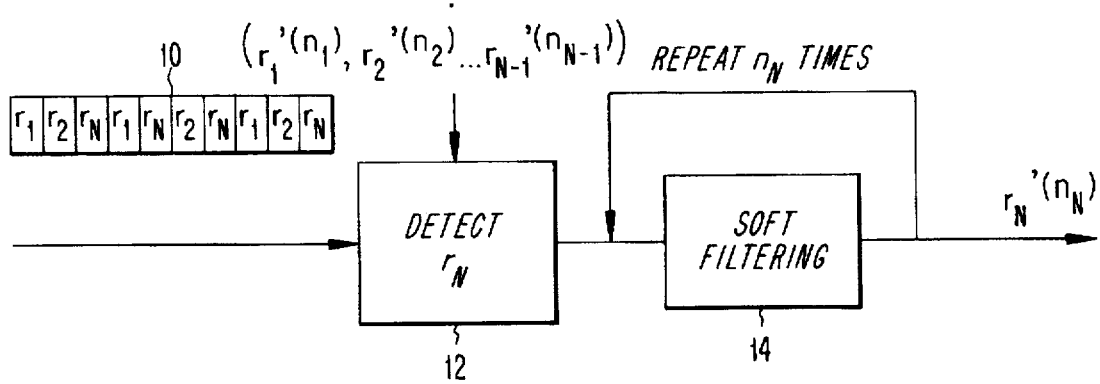

Referring now to FIGS. 1A–C, a method for detecting communication symbols according to a first embodiment of the present invention is shown. In FIGS. 1A–C, a group (e.g., a code word) of symbols 10 includes symbols $r_1$ having a first level of coding protection, symbols $r_2$ having a second level of coding protection, and symbols $r_N$ having an Nth level of coding protection. The coded symbols may be modulated at a transmitter (not shown) using e.g., Gaussian minimum shift keying (GMSK, used in the GSM system) or $\pi/4$ differential quadriphase shift keying ($\pi/4$ DQPSK, used in the D-AMPS mobile communication system). In FIG. 1A, detector 12 detects the symbols $r_1$ having the first level of coding protection, and generates soft reliability information for the transmitted code word. The detector 12 can, for example, be implemented by a soft output Viterbi algorithm (SOVA) detector. A soft filtering circuit 14 filters the soft reliability information, and outputs a soft reliability value $r_1'(n_1)$. Soft filtering circuit 14 can include means for implementing a SOVA algorithm or can implement separable maximum a posteriori (S-MAP) filtering. The circuit of FIG. 1A can be provided with a feedback loop to feed the soft filtering circuit output back to its input some number of times $n_1$ as necessary to improve the soft reliability information. It will be appreciated that such a feedback loop is not necessary, and that such feedback techniques are well-known in the art. Accordingly, the details of the implementation or how many feedback iterations should be performed will not be discussed herein.

In FIG. 1B, the soft reliability value $r_1'(n_1)$ is supplied to the detector 12 to detect the symbols $r_2$ having the second level of coding protection. The decoded $r_2$ symbols are filtered in filtering circuit 14, and the output of filtering circuit 14 can be fed back some number $n_2$ of times as necessary to generate soft reliability value $r_2'(n_2)$. In FIG. 1C, it is assumed that some number of detections (n–1)–2 has occurred after the detection of the $r_2$ symbols and that each detection has resulted in soft reliability values $r_3'(n_3)$, ... $r_{N-1}'(n_{N-1})$ for each level of coding. In FIG. 1C, the soft reliability values $r_1'(n_1)$, ... $r_{N-1}'(n_{N-1})$ are supplied to the detector 12 to detect the symbols $r_N$ having the Nth level of coding protection and generate a soft reliability value which is filtered and optionally fed back $n_N$ times to generate soft reliability value $r_N'(n_N)$. It will be appreciated that the entire detection procedure could be repeated any number of times using all of the reliability information obtained from all previous detections, thus enabling the less-protected symbols to assist in the more accurate detection of the more-protected symbols.

It will be appreciated that interleaving can also be implemented to enhance the performance of the communication system. In an exemplary interleaving scheme according to the present invention, frames of coded data symbols are interleaved and transmitted in bursts. The data symbols are detected in groups at the receiver according to their level of coding protection, as shown above with respect to FIGS. 1A–C. The detected symbols are then deinterleaved, decoded, reinterleaved together with the soft reliability information, and mapped into their representation in the received bursts.

It will further be appreciated that a cascaded error detecting code, such as a CRC code can be used in conjunction with the soft information to further enhance the decoding. CRC codes are frequently used to detect decoding failures of an error correction code. If the CRC indicates that errors remain after a decoding operation, then the feedback (both soft and hard information) is known to be at least partially unreliable, and the feedback can be switched off by an appropriate switching mechanism (not shown). More specifically, one or more of the N classes of encoded symbols can be encoded with a CRC code, either alone or in addition to other error coding. Using such a code, redundancy bits r0,r1, ... rn–1 are included in the transmission of corresponding data bits d0,d1, ... dn–1. As an example, r0 may be dependent upon d0,d2, and d7 according to r0=d0⊕d2⊕d7. The CRC code allows the receiver to check bits d0,d2, and d7 to determine if the dependency relationship is still valid. If the dependency is no longer valid at the receiver, an error has occurred during the transmission.

The use of unequal error protection (UEP) in the transmitted signal allows the receiver to recursively propagate the redundancy to classes of transmitted symbols which receive a lower level of coding protection, and the use of soft output channel detectors and decoders enhances the performance of the system. After symbols having a given level of coding protection are detected and de-interleaved (if necessary), the symbols will have likelihood measurements (soft information) associated with them. The likelihood values represent a-posteriori knowledge and are compared with the corresponding received signal values in the detector for a second group of symbols. When all classes have been detected, the symbols can be re-detected any number of times to increase the transmission performance for symbols of all classes.

Figure 2:
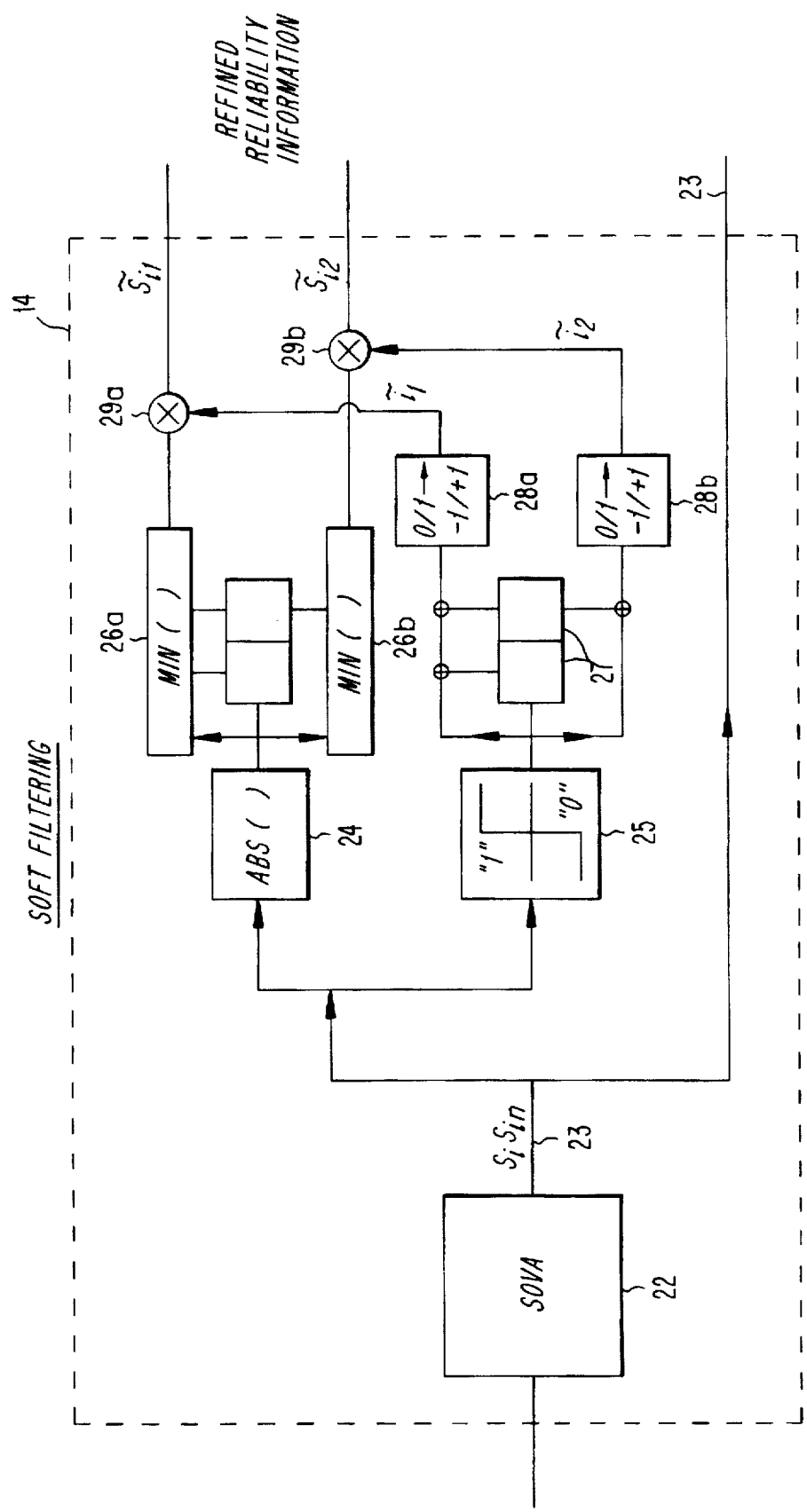
FIG. 2 is a diagram of an exemplary soft filtering circuit for use in the circuitry of FIG. 1.

Referring now to FIG. 2, a block diagram of a suitable filtering circuit for use in the receiver of FIGS. 1A–C is shown. The circuit includes a SOVA decoder 22 which receives reliability values associated with hypothesized code bits and outputs, at 23, soft reliability information on the decoded information symbols. Block 24 determines the absolute value of the soft reliability information, and block 25 converts the soft reliability information from a negative or positive value into a binary 1 or 0, respectively. Blocks 26a and 26b receive the absolute values of the soft reliability information from block 24 and choose the smallest value of two or any number of values. The circuit further includes a shift register 27, each cell of which contains a binary value. The shift register 27 operates as a conventional convolutional encoder and performs, e.g., modulo 2 binary addition. Blocks 28a and 28b convert the binary output from shift register 27 into real numbers to generate hard decision code bits. Multipliers 29a and 29b multiply reliability values from blocks minimum operation blocks 26a and 26b with the hard decision outputs of blocks 28a and 28b, respectively to generate refined reliability information. Thus, in the circuit of FIG. 2, one or more soft (reliability) values associated with decoded bits $S_i$ are output by the SOVA decoder 22, and are processed by the circuit to generate one or more refined soft (reliability) values ($S'_{i1}$, $S'_{i2}$) associated with the corresponding reencoded bits. As will be appreciated by those of skill in the art, the filtering circuit differs from a conventional "hard" channel encoder in that modulo-2 adders are replaced by minimum operations. The filtering circuit in FIG. 2 includes a convolutional encoder 27 with a rate of e.g., 1/2, and the bits have bipolar representation. The minimum operations min() determine, for each coded bit, a soft value of the smallest absolute value of the bits that affect it. Instead of the circuit of FIG. 2, a posteriori reliability values of reencoded and remodulated code symbols can be generated according to an algorithm such as is described in Lodge et al., "Separable MAP Filters for the Decoding of Product and Concatenated Codes (ICC93), Geneva, May 1993. This algorithm calculates a posteriori probabilities for code bits that correspond to the decoded information bits while performing the decoding. Other suitable methods of calculating soft reliability information can be readily implemented by those of ordinary skill in the art.

A logic circuit (not shown) can be used to convert the previously detected and decoded symbols into reference signals, and to supply the reference signals to the detector for the symbols to be re-detected or to assist in the detection of other symbols. It will be appreciated that the specific implementation details of such a logic circuit will necessarily depend upon the type of modulation and the type of detector.

One or more of the N classes of encoded symbols can be encoded with a cyclic redundancy check (CRC), either alone or in addition to other error protection coding. If CRC coding is used in one or more of the N classes of encoded symbols, a CRC switch 20 allows the formation of a loop for repeating the detection of the received symbols. It will be appreciated that the use of soft information in the method of the present invention reduces the need for repeated detection and the need for a CRC check.

The operation of the receiver will now be described, assuming differential modulation (DQPSK) and a SOVA detector as detector 12. A mapping from received bits to differential symbols is given in the following Table 1:

| BITS | DIFFERENTIAL SYMBOL |
| --- | --- |
| −1, −1 | 0 |
| −1, +1 | $\pi/2$ |
| +1, +1 | $\pi$ |
| +1, −1 | $3\pi/2$ |

For a received signal y, the bits associated with the differential symbol y(k−1)→y(k) are considered to be known, as they belong to previously detected and decoded classes. For example, if the known soft values (reliability information in a scaled logarithmic probability value representation) determined by the decoder are −250,−1750, then the most likely transmitted differential symbol is 0. If the transition was known as a certainty to be 0 (i.e., the bit pair −1,−1), only that transition would be allowed in the Viterbi trellis, and other transitions would be omitted or "pruned" in the decoder. Such a "hard" trellis pruning, as shown by the solid lines in FIG. 3, corresponds to adding an infinite metric, or additive reliability measure (e.g., a scaled logarithm of probability) to all transitions other than the transition corresponding to the (presumably) known transition. It is assumed that an infinite metric corresponds to a transition with a zero probability that a small (large) finite value corresponds to a likely (unlikely) transition. The detection of the surrounding, unknown differential symbols is enhanced by this hard pruning, particularly if there is inter-symbol interference (ISI).

If the "known" bits have soft values associated with them (e.g., −250,−1750), a softer trellis pruning can be implemented which adds finite metrics to the ordinary transition metrics. In the above example, the soft values (reliability information) associated with the known bits are −250 and −1750, and thus the corresponding most likely hard values are −1 and −1, respectively. Thus, (−1,−1) is the most likely transition and the other transitions (−1, +1); (+1,−1); and (+1,+1) are considered unlikely. In the following Table 2, the soft metric value that should be added to the transition metrics of the state transitions in the decoder are given, where both bits are known:

| Hypothesized Bits | Diff. Symbol | Soft Metric Value |
| --- | --- | --- |
| −1, −1 | 0 | −250 + (−1750) = −2000 |
| −1, +1 | $\pi/2$ | −250 + (+1750) = +1500 |
| +1, +1 | $\pi$ | +250 + (+1750) = +2000 |
| +1, −1 | $3\pi/2$ | +250 + (−1750) = −1500 |

It will be appreciated that a metric value corresponding to a whole or partial information word or code word is a value reflecting the reliability of the whole or partial word. The most common metric types are a multiplicative metric, generated as a product of probabilities, and a logarithmic metric, which is a sum of logarithms of probabilities of the received symbols. If additional information is available, such as information reflecting the a priori or a posteriori probability of one or more information or code bits, this information can be used to enhance the detection. For example, if it is known that approximately 70% of bits are ones, instead of the typically hypothesized 50%, the probabilities 0.70 and 0.30 can be used together with the received soft data values to compute the transition metrics for decoding these bits.

According to an aspect of the present invention, these probabilities are estimated for the code bits. The redundancy of the code words allows for enhanced re-encoding and enhanced re-detection. In this manner, the error correction code and/or the memory of the modulation and the channel in the first stage can be used to detected the bits having the relatively lower levels of protection.

It will be appreciated that the metrics reflected in Table 2 assume that the metric is to be minimized, and that the opposite signs may be used. As shown in Table 2, the metric values are the highest for the differential symbol transitions (−1, +1) and (+1, +1); therefore, these transitions are the most unlikely. If, unlike the method of the present invention, a hard pruning is used the metrics for all transitions except the most likely (−1,−1) are infinite; that is, all other metrics are eliminated, and only the best transition is used to influence the redetection. If the best transition is the correct transition, the hard pruning approach is good; however, if the best (most likely) metric is incorrect, the hard pruning approach is undesirable, since the correct metric is effectively forbidden from consideration. Using the soft approach of the present invention, all transitions are allowed, and none are excluded; thus, if the best (most likely) transition is incorrect, the correct transition still survives and can be used as the best transition in a later iteration. As the number of iterations and/or the number of modulation/coding stages increases, the benefits achieved by the present invention increase, and error propagation due to erroneous decoding can be significantly reduced.

The following Table 3 shows the soft metric costs where only one of the bits, the first bit of the differential symbol y(k−1)→y(k), is known, and that its soft value is −250:

| Hypothesized Bits | Diff. Symbol | Soft Metric Cost |
|---|---|---|
| −1, −1 | 0 | −250 + metric for unknown bit |
| −1, +1 | π/2 | −250 + metric for unknown bit |
| +1, +1 | π | +250 + metric for unknown bit |
| +1, −1 | 3π/2 | +250 + metric for unknown bit |

It will be appreciated that with hard pruning, the transition metrics for (+1,X) would be infinite.

Figure 3:
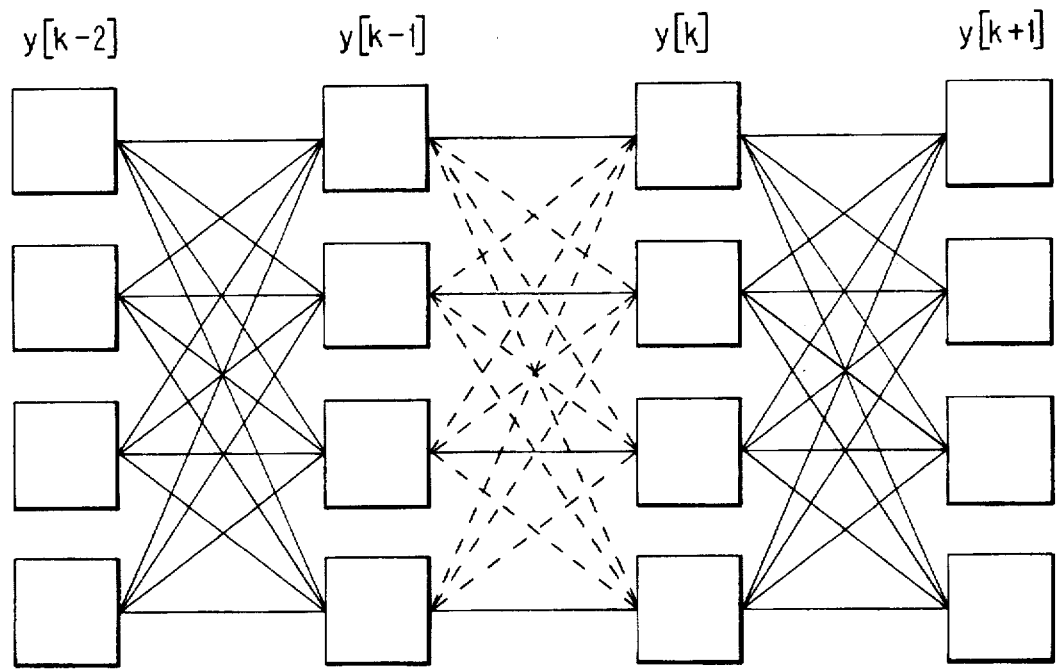
FIG. 3 is a diagram of a Viterbi algorithm trellis.

Referring now to FIG. 3, a block diagram of a Viterbi decoding trellis is shown. According to the Viterbi algorithm, a received sequence of data bits or symbols (designated by a block in FIG. 3) is compared with allowed or possible sequences, and a soft (reliability) value is assigned to each comparison to indicate the likelihood that the possible sequence is a correct sequence.

Figure 4:
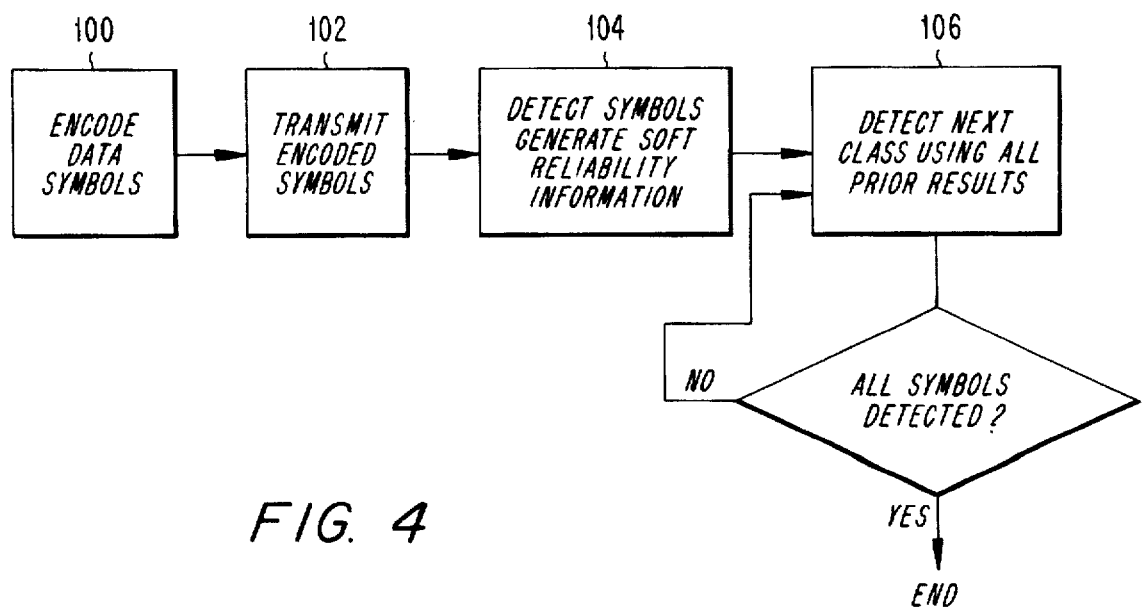
FIG. 4 is a flow chart describing the transmission method according to an embodiment of the present invention.

Referring now to FIG. 4, a flow chart describing an exemplary transmission method of the present invention is shown. In step 100, data symbols to be transmitted are encoded with one of N levels of coding protection in a suitable encoder according to any unequal error protection scheme. The encoded data symbols are transmitted from a transmitter to a receiver in step 102. In step 104, the group of symbols having the highest level of coding protection is detected, and soft reliability information indicative of the actual representation of the detected symbols in the received signal. In step 106, the group of symbols having the next highest level of coding protection is detected using the reference signal produced in step 104 to assist in the decoding process. Decoded, re-encoded, and remodulated using the reference signal produced in step 104 to assist in the decoding process. The decoded and remodulated second class of symbols re-creates their actual representations in the received signal. Step 106 is repeated as many times as necessary to decode all classes of symbols.

The method described in FIG. 4 may be modified to provide for interleaving of coded symbols, as will now be described. Referring now to FIG. 5, a diagram showing interleaved bursts of coded symbols received according to the present invention. The source encoder at the transmitter produces frames $F_c(k)$ of data. Each frame includes symbols with different levels of coding protection. A suitable interleaver interleaves the data symbols of coded frames $F_c(k)$ into D bursts B(k) for transmission to the receiver in step 102. In the example shown in FIG. 5, block-diagonal interleaving is used; however, it will be appreciated that other suitable interleaving patterns can also be used. Each burst B(k) includes symbols $f_{nd}(k)$, where $1 \leq n \leq N$, and $1 \leq d \leq D$. Each symbol $f_{nd}(k)$ belongs to a class n transmitted in a burst B(k−d−1). It will be appreciated that FIG. 5 shows the case where N=3 and D=3. When the bursts B(k−2), B(k−1) and B(k) have been received, the detection of the symbols of the highest class can begin. In this example, the interleaving results in the symbols being spread out over three frames. Assuming that the class n=1 has the highest level of protection (most redundancy) and that the class n=3 has the lowest level of protection (least redundancy), the first symbols to be detected are the symbols $f_{11}(k)$ from burst B(k); $f_{12}(k)$ from burst B(k−1), and $f_{13}(k)$ from burst B(k−2). These symbols are detected, de-interleaved, decoded, re-encoded, re-interleaved, and remodulated to re-create their representations in the received bursts. This information is used by the detector 12 to assist in the detection of the next class of encoded symbols (symbols $f_{21}(k)$, $f_{22}(k)$, and $f_{23}(k)$) having the next highest level of coding protection. The process is repeated, using information generated from all previous detected classes to assist in the detection of later classes having lower levels of protection. When all classes in a given series of bursts have been detected, the next burst B(k+1) is received and the frame $F_c(k+1)$ is detected and decoded as described above.

Although a transmission method of the present invention is preferably implemented using an FEC-assisted detection scheme, it will be appreciated that the present invention may be alternatively implemented in any type of transmission system that uses unequal error protection and has some form of channel memory through modulation and/or time dispersion, such as the existing GSM, PDC, and D-AMPS cellular communication systems. The present invention will significantly improve the performance of any system which is performance-limited by its least protected symbols.

While the foregoing description includes many details and specificities, it is to be understood that these are merely illustrative and do not limit the scope of the invention in any way. Many modifications will be readily apparent to those of ordinary skill in the art which do not depart from the spirit and scope of the invention, as defined by the following claims and their legal equivalents.

What is claimed is:

1. A method for receiving digital communication signals including coded data symbols, comprising the steps of:

detecting a first group of coded data symbols having a first level of coding protection;

decoding the first group of coded data symbols and generating first soft reliability information based on the decoding;

detecting and decoding a second group of coded data symbols having a second level of coding protection using the decoded first group of symbols and the first soft reliability information.

2. The method of claim 1, wherein one or more groups of coded data symbols include cyclic redundancy check (CRC) coding information, and wherein the steps of detecting and decoding are performed a plurality of times for each of the one or more groups of coded data symbols including CRC coding information.

3. The method of claim 1, wherein the coded data symbols are interleaved in the digital communication signals, and the method further comprises the steps of: deinterleaving the detected first group of coded data symbols prior to the step of decoding; and re-interleaving the detected and decoded data symbols.

4. The method of claim 1, further comprising the steps of:

generating second soft reliability information based on the decoding of the second group of data symbols; and detecting and decoding a third group of coded data symbols having a third level of coding protection using the decoded first and second groups of symbols and the first and second soft reliability information.

5. A method for transmitting digital communication signals, comprising the steps of:

generating, in a channel encoder, frames of encoded data symbols, each of the encoded data symbols having one of N levels of coding protection;

transmitting the frames of encoded data symbols to a receiver in a series of D bursts;

detecting and decoding, at the receiver, transmitted encoded data symbols having a first level of coding protection, the transmitted encoded data symbols having the first level of protection being located in one or more of the D bursts;

generating first soft reliability information based on the detection of the transmitted encoded data symbols having the first level of protection; and detecting, at the receiver, transmitted encoded data symbols having a second level of coding protection using the first soft reliability information.

6. The method of claim 5, further comprising the steps of:

interleaving the encoded data symbols prior to the step of transmitting; and deinterleaving the detected symbols at the receiver.

7. The method of claim 5, wherein one or more groups of coded data symbols include cyclic redundancy check (CRC) coding information, and wherein the steps of detecting, de-interleaving, decoding are performed a plurality of times for each of the one or more groups of coded data symbols including cyclic redundancy check (CRC) coding information.

8. The method of claim 5, further comprising the steps of:

re-encoding and re-interleaving the decoded second group of data symbols;

generating second soft reliability information; and detecting transmitted coded data symbols having a third level of coding protection using the first and second soft reliability information.

9. A receiver for receiving digital communication signals having coded data symbols, comprising:

a detector for detecting coded data symbols received from a transmitter;

a soft filtering circuit for generating soft reliability information from the detected data symbols; and the detector using the soft reliability information from previously-detected and decoded data symbols to detect later coded data symbols.

10. The receiver of claim 9, further comprising means for performing a cyclic redundancy check for detecting and decoding coded data symbols having CRC coding information.

11. A method for receiving digital communication signals transmitted from a transmitter including coded data symbols, each coded data symbol having one of N levels of coding protection, comprising the steps of:

detecting a first group of coded data symbols having a first of the N levels of coding protection;

decoding the first group of coded data symbols and generating first soft reliability information based on the decoding; and detecting and decoding each of the remaining groups of symbols having one of the remaining N−1 levels of coding protection by using previously decoded groups of symbols and previously generated soft reliability information.

12. The method of claim 11, further comprising the step of refining the soft reliability information using a feedback loop.

13. The method of claim 11, wherein one of the N levels of coding protection is no coding protection.

14. The method of claim 11, wherein the step of generating soft reliability information is performed by a SOVA decoder.

15. The method of claim 11, wherein the step of generating soft reliability information is performed by a separable MAP filter.

16. The method of claim 11, wherein the coded data symbols are differentially modulated at the transmitter.

17. The method of claim 16, wherein the coded data symbols are modulated using differential quadriphase shift keying at the transmitter.

18. The method of claim 17, wherein the coded data symbols are modulated using π/4DQPSK.

19. The method of claim 11, wherein the coded data symbols are modulated using Gaussian minimum shift keying at the transmitter.

20. The method of claim 11, wherein the step of detecting and decoding each of the remaining groups of symbols is performed by using all previously generated soft reliability information.

21. The method of claim 11, further comprising the step of performing a second detection and decoding of the coded data symbols using all previously decoded groups of symbols.

* * * * *